United States Patent [19]

Hamakawa et al.

[11] 4,450,316
[45] May 22, 1984

[54] AMORPHOUS SILICON PHOTOVOLTAIC DEVICE HAVING TWO-LAYER TRANSPARENT ELECTRODE

[75] Inventors: Yoshihiro Hamakawa, Kawanishi; Yoshihisa Tawada, Kobe, both of Japan

[73] Assignee: Kanegafuchi Kagaku Kogyo Kabushiki Kaisha, Osaka, Japan

[21] Appl. No.: 399,312

[22] Filed: Jul. 19, 1982

[30] Foreign Application Priority Data

Jul. 17, 1981 [JP] Japan .................................. 56-112571
Jul. 17, 1981 [JP] Japan .................................. 56-112572

[51] Int. Cl.$^3$ ............................................. H01L 31/06
[52] U.S. Cl. .................................... 136/256; 136/258; 357/30
[58] Field of Search ................. 75/134 S; 252/62.3 R, 252/62.3 C, 501.1, 504, 516; 136/258 AM, 256; 357/2, 30; 423/345, 346

[56] References Cited

U.S. PATENT DOCUMENTS 4,109,271 8/1978 Pankove ............................... 357/30

FOREIGN PATENT DOCUMENTS 55-29154 3/1980 Japan ........................... 136/258 AM

*Primary Examiner*—Aaron Weisstuch
*Attorney, Agent, or Firm*—Armstrong, Nikaido, Marmelstein & Kubovcik

[57] ABSTRACT

An amorphous silicon semiconductor of the general formula: a-Si$_{(1-x-y)}$C$_x$N$_y$ containing hydrogen and/or fluorine, which provides an amorphous silicon PIN junction photovoltaic device having an improved conversion efficiency when it is used as a P-type or N-type layer on the light impinging side of the PIN junction photovoltaic device. Also, the conversion efficiency of an amorphous silicon PIN junction photovoltaic device is improved by using a two-layer film structure of ITO and SnO$_2$ as a transparent electrode for the photovoltaic device, with the SnO$_2$ layer contacting the P or N layer. The improvement is particularly marked in the case of heterojunction photovoltaic devices.

4 Claims, 6 Drawing Figures

4,450,316

AMORPHOUS SILICON PHOTOVOLTAIC DEVICE HAVING TWO-LAYER TRANSPARENT ELECTRODE

BACKGROUND OF THE INVENTION

The present invention relates to an amorphous silicon semiconductor and an amorphous silicon photovoltaic device.

Since it was found in 1976 by W. E. Spear et al. that the conductivity of the amorphous silicon obtained by a plasma decomposition method of silane ($SiH_4$) could be greatly altered by doping with phosphine ($PH_3$) and diborane ($B_2H_6$) and an amorphous silicon solar cell was fabricated on an experimental basis in 1976 by D. E. Carlson et al., the amorphous silicon solar cell has attracted attention and many studies with the aim of improvement of its efficiency have been made.

The Schottky barrier type, PIN type, MIS type and heterojunction type are known structures of photovoltaic devices using an amorphous silicon thin film. The former three types promise to provide highly efficient solar cells. For instance, a Schottky barrier type solar cell made by D. E. Carlson et al. in 1977 showed a conversion efficiency of 5.5%, an MIS type solar cell made by J. I. B. Wilson et al. in 1978 showed a conversion efficiency of 4.8%, and a PIN junction solar cell made by Yoshihiro Hamakawa in 1978 showed a conversion efficiency of 4.5%.

In the case of the PIN junction solar cell, the P or N type amorphous silicon has a short carrier life time and, therefore, fails to provide effective carriers. Also, the P-layer suffers from light absorption loss because it has a higher light absorption coefficient than the I-layer. In order to eliminate these drawbacks, an inverted PIN junction photovoltaic device has been proposed. This photovoltaic device is constructed so that the light impinges on the N-type amorphous silicon side. Since this device has a smaller light absorption coefficient than the P-type, it is believed to be more advantageous, though slightly. Nevertheless this N-type amorphous silicon is no better than the P-type in the sense that it similarly suffers from light absorption loss.

Also, in the case of the PIN junction solar cell, it is necessary to form a transparent electrode on the light-impinging side, and ITO (indium-tin-oxide) ($In_2O_3 + SnO_2$) or $SnO_2$ has been employed as a transparent electrode. However, cells with the ITO electrode have the disadvantage that while the fill factor is good, the open circuit voltage is low, and cells with the $SnO_2$ electrode have the disadvantage that while the open circuit voltage is high, the fill factor is bad.

It is an object of the present invention to provide an amorphous silicon semiconductor suitable for use in fabricating an amorphous silicon PIN junction photovoltaic device.

Another object of the invention is to provide an amorphous silicon PIN junction photovoltaic device having an improved conversion efficiency.

It is a still further object to provide a two-layer transparent electrode on the light impinging side of an amorphous silicon type solar cell.

These and other objects of the present invention will become apparent from the description hereinafter.

SUMMARY OF THE INVENTION

It has now been found that the short-circuit current density and the open circuit voltage are greatly improved by using in at least one of the P and N layers of a PIN junction photovoltaic device a P-type or N-type doped thin film of a hydrogenated amorphous silicon carbon nitride of the general formula: a-$Si_{(1-x-y)}C_x$-$N_y$:H or a partially fluorinated amorphous silicon carbon nitride of the general formula: a-$Si_{(1-x-y)}C_x$-$N_y$:F:H (they being hereinafter referred to as merely "amorphous silicon carbon nitride" or "a-$Si_{(1-x-y)}C_xN_y$").

In accordance with the present invention, there is provided an amorphous semiconductor having the general formula: a-$Si_{(1-x-y)}C_xN_y$.

The present invention also provides an improved amorphous silicon PIN junction photovoltaic device in which at least one of the P-type and N-type amorphous silicon semiconductors thereof is an amorphous semiconductor of the general formula: a-$Si_{(1-x-y)}C_xN_y$.

In one preferred embodiment, this invention provides in an amorphous silicon derivatives PIN junction photovoltaic device, the improvement comprising a two layer transparent electrode consisting of ITO and $SnO_2$ layers that are provided on the P or N layer located on the light impinging side so that the $SnO_2$ layer is in contact with said P or N layer, said $SnO_2$ layer having a thickness of about 30 to about 500 angstroms.

The photovoltaic device of the present invention is useful as solar cells, photoswitches, and the like.

DETAILED DESCRIPTION

The term "amorphous silicon" as used herein means the hydrogenated or fluorinated silicon, and comprehends amorphous silicon derivatives such as a-SiGe:H, a-SiGe:F:H, a-SiSn:H, a-SiSn:F:H, a-SiSnGe:H, a-SiSnGe:F:H and so on.

Amorphous silicon used in the present invention is obtained by subjecting a mixed gas containing a silicon compound, e.g. monosilane, a polysilane such as disilane, silane fluoride or a derivative thereof, or a mixture thereof, and hydrogen or an inert gas such as argon or helium diluted with hydrogen, and if necessary, further with $GeH_4$ and/or $SnH_4$, to radio-frequency glow decomposition or DC glow discharge decomposition by the capacitive or inductive coupling method. The concentration of silane in the mixed gas generally is in the range of from 0.5 to 100%. The concentration of the silane derivatives is suitably determined in accordance with the composition of the desired product and the glow discharge decomposition conditions.

The substrate should have a working temperature in the range of from about 200° to about 300° C. The substrates used in the invention include a glass sheet having a transparent electrode (e.g. ITO and SnO$_2$) vacuum deposited thereon, a metallized polymer film, a metal sheet and all other known materials used as substrates in the fabrication of solar cells.

Figure 1A:
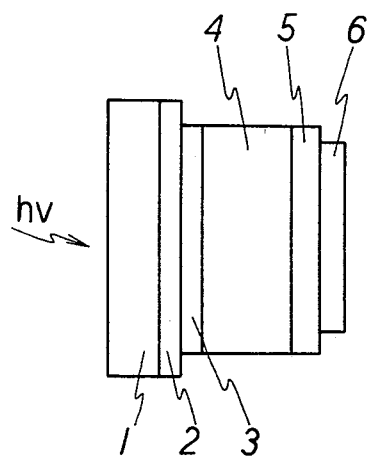
FIG. 1(a) is a schematic view illustrating the structure of a photovoltaic device of the type wherein the light impinges on the P-layer side.
Figure 1B:
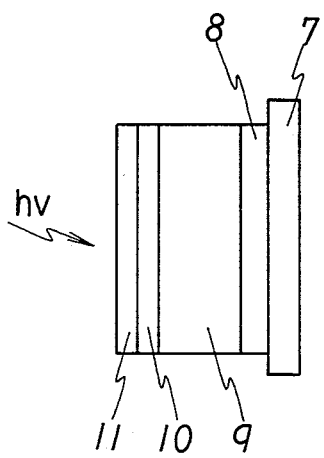
FIG. 1(b) is a schematic view illustrating the structure of a photovoltaic device of the type wherein the light impinges on the N-layer side.

Typical examples of the basic construction of a solar cell are shown in FIGS. 1(a) and 1(b). Illustrated in FIG. 1(a) is a solar cell of the type wherein the light impinges on the P-layer side. For instance, the solar cell of this type has the construction: glass-transparent electrode-P-I-N-Al. Illustrated in FIG. 1(b) is a solar cell of the type wherein the light impinges on the N-layer side. For instance, the solar cell of this type has the construction: stainless steel-P-I-N-transparent electrode. Optionally, other constructions may be formed by interposing a thin insulation layer or a thin metal layer between the P-layer or N-layer and the transparent electrode. Any construction suffices so far as the PIN junction is included as the basic component.

Intrinsic amorphous silicon (hereinafter referred to as "I-type a-Si") obtained by the glow discharge decomposition of silane or a derivative thereof, silane fluoride or a derivative thereof, or a mixture thereof, and an amorphous silicon derivative such as a-SiGe or a-SiSn, which has a carrier life time of not less than about $10^{-8}$ second, a density of localized states of not more than about $10^{18}$ cm$^3$eV$^1$ and a mobility of not less than $10^{-4}$ cm$^2$/V·sec., is employed in the present invention as the I-type layer of amorphous silicon derivative photovoltaic cells. I-type a-Si and the amorphous silicon derivatives of the invention may be employed alone or in combination thereof as an I-layer. The PIN junction structure is formed by joining P-type and N-type doped amorphous silicon semiconductors to the I-layer. The construction contemplated by the present invention is characterized by using, in at least one of the P-layer and N-layer, specifically in the layer on which the light impinges, an amorphous semiconductor of the general formula: a-Si$_{(1-x-y)}$C$_x$N$_y$, containing hydrogen or fluorine. Both of the P and N layers may be made of this particular amorphous semiconductor. The doped layer which does not use the above-mentioned particular amorphous semiconductor of the present invention is formed by doping the above-mentioned I-type a-Si with an element of Group III of the Periodic Table to provide the P-type a-Si, or by doping with an element of Group V of the Periodic Table to provide the N-type a-Si. This P-type or N-type a-Si may be used in combination with or replaced with the P-type or N-type amorphous silicon derivatives.

The amorphous semiconductor of the present invention is made of amorphous silicon carbon nitride represented by the general formula: a-Si$_{(1-x-y)}$C$_x$N$_y$. The amorphous silicon semiconductor of the general formula: a-Si$_{(1-x-y)}$C$_x$N$_y$ in which x and y satisfy the following equations: $0.05 \leq x \leq 0.75$, $0.05 \leq y \leq 0.75$ and $0.05 \leq x+y \leq 0.80$, is preferable. The amorphous silicon carbon nitride is obtained by subjecting the above-mentioned silicon compound, e.g. silicon hydrides such as SiH$_4$ or silicon fluorides such as SiF$_4$, a carbon compound such as hydrocarbons or carbon fluoride, and a nitrogen compound, e.g. nitrogen or hydrogenated nitrogens such as NH$_3$ and hydrazine, to the glow discharge decomposition. It contains 0.5 to 30 atom % of hydrogen and/or fluorine. When the amorphous silicon carbon nitride semiconductor is employed as a P-layer or an N-layer of a photovoltaic device, it is doped with P-type or N-type impurities. A P-type or N-type amorphous semiconductor having an optical band gap of not less than about 1.85 eV, an electric conductivity of not less than about $10^{-8}$ ($\Omega$.cm)$^{-1}$ at 20° C. and a diffusion potential (Vd) (exhibited in the PIN junction) of not less than about 1.1 volts is preferred.

Figure 2:
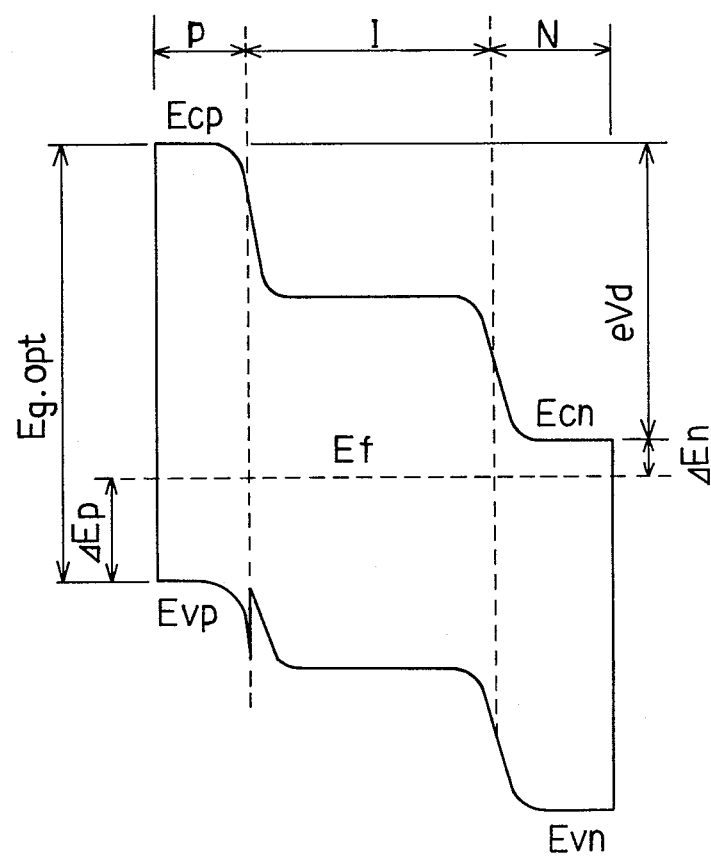
FIG. 2 is a diagram showing an energy band profile of the PIN heterojunction photovoltaic device of the present invention.

The amorphous silicon carbon nitride semiconductor of the present invention has a large optical band gap and exhibits a very high open circuit voltage (Voc), though the semiconductor, when used as a window material for the PIN junction photovoltaic device, naturally has a possibility of increasing the short-circuit current density (Jsc). It has been found that in the photovoltaic device of the present invention, there is a correlation between the diffusion potential (Vd) and the open circuit voltage of the device as depicted by the band profile of FIG. 2. Although the diffusion potential (Vd) in the case of the invention exceeds about 1.1 volts, the trend of the relation is nearly constant without reference to the kind of the amorphous semiconductor to be used on the side exposed to the incident light. This diffusion potential is the difference obtained by subtracting the Fermi level (Ef) of the P, N doped layers from the optical band gap (Eg.opt) of the amorphous semiconductor on the side exposed to the light. Let Ecn stand for the energy level of the conduction band on the N side and Evp for the energy level of the valence band on the P side, and the activation energies $\Delta$Ep and $\Delta$En can be determined based on the dependency of electric conductivity on temperature, as shown in FIG. 2. Since $\Delta$Ep=Ef−Evp holds for the P type and $\Delta$En=Ecn−Ef for the N type, there ensues eVd=Eg.opt−($\Delta$Ep+$\Delta$En). In the case light incidence on the N side, the diffusion potential is similarly obtained by subtracting the Fermi level (Ef) of the P, N layers from the optical band gap (Eg.opt) of the N type amorphous semiconductor.

It is preferable that the amorphous semiconductor of the invention shown by the general formula: a-Si$_{(1-x-y)}$C$_x$N$_y$, have an optical band gap (Eg.opt) of at least about 1.85 eV and a diffusion potential (Vd) of at least about 1.1 volts. By employing an amorphous semiconductor which satisfies this requirement, the heterojunction photovoltaic device is allowed to enjoy a great improvement in short-circuit current density (Jsc) and open circuit voltage (Voc). It is further preferred that the electric conductivity of the amorphous semiconductor of the invention be at least $10^{-8}$ ($\Omega$.cm)$^{-1}$ at room temperature. When the electric conductivity is less than $10^{-8}$ ($\Omega$.cm.)$^{-1}$, the fill factor (FF) becomes small and the conversion efficiency of the obtained photovoltaic device is not practical.

The PIN junction photovoltaic device provided by the present invention will be described specifically below. In one typical construction as shown in FIG. 1(a), the device is of the type wherein the light impinges on the P-layer side, and is composed of substrate 1 such as glass, transparent electrode 2, P-type amorphous semiconductor 3, I-type amorphous silicon 4, N-type amorphous semiconductor 5 and electrode 6. The amorphous silicon carbon nitride semiconductor of the present invention is used at least in the layer on which the light impinges, and for instance, the photovoltaic cell of the invention has the construction transparent electrode-P type a-Si$_{(1-x-y)}$C$_x$N$_y$-I type a-Si-N type a-Si-electrode, with the transparent electrode side to be exposed to the incident light. The transparent electrode is desired to be formed of ITO or $SnO_2$, preferably the latter. The transparent electrode may be previously formed by vacuum deposition on a glass substrate or may be directly formed by vacuum deposition on the P type amorphous semiconductor.

The P type a-$Si_{(1-x-y)}C_xN_y$ layer on the light impinging side is desired to have a thickness of from about 30 Å to about 300 Å, preferably from 50 Å to 200 Å. Although the thickness of the I type a-Si layer is not specifically limited in the device of the present invention, it is generally selected from about 2,500 Å to about 10,000 Å. Also, the thickness of the N type a-Si layer is not specifically limited, but is usually selected from about 150 Å to about 600 Å. Optionally, this N type a-Si layer may be substituted for the N type a-$Si_{(1-x-y)}C_xN_y$ of the present invention.

In another typical construction as shown in FIG. 1(b), the device is composed of electrode substrate 7, P-type amorphous semiconductor 8, I-type amorphous silicon 9, N-type amorphous semiconductor 10 and transparent electrode 11, and the transparent electrode side is exposed to the light. The photovoltaic device of this type has the construction: transparent electrode-N type a-$Si_{(1-x-y)}C_xN_y$-I type a-Si-P type a Si-electrode. The N type a-$Si_{(1-x-y)}C_xN_y$ on the light impinging side is desired to have a thickness of from about 30 Å to about 300 Å, preferably from 50 Å to 200 Å. Although the thickness of the I type a-Si is not specifically limited, it is generally selected from about 2,500 Å to about 10,000 Å. The thickness of the P type a-Si layer, which is not particularly limited, is generally selected from about 150 Å to about 600 Å. Optionally, this P type a-Si layer may be substituted for by the P type a-$Si_{(1-x-y)}C_xN_y$ of the present invention. The material for the transparent electrode and the method for the vacuum deposition thereof are the same as described above.

The present inventors have also found that the fill factor and open circuit voltage can be greatly improved by providing ITO-$SnO_2$ layers as a transparent electrode on the light impinging layer of a PIN junction photovoltaic device so that the $SnO_2$ layer has a thickness of about 30 Å to about 500 Å, preferably about 50 Å to 500 Å, and comes into contact with the light impinging P or N layer. Accordingly, the present invention provides an amorphous silicon PIN junction photovoltaic device having a high conversion efficiency which is improved in that it has a structure of ITO-$SnO_2$-P-I-N or ITO-$SnO_2$-N-I-P and the thickness of the $SnO_2$ layer is from about 30 Å to about 500 Å.

Figure 4A:
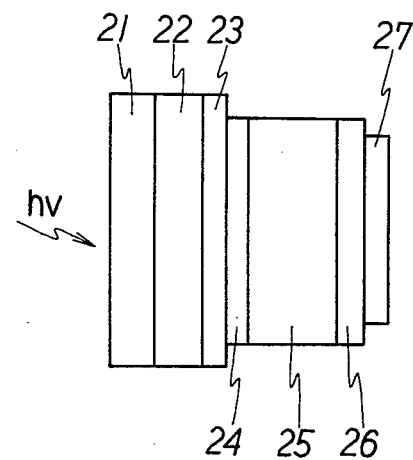
FIG. 4(a) is a schematic view illustrating the structure of a photovoltaic device of another type according to the present invention wherein the light impinges on the P-layer side.
Figure 4B:
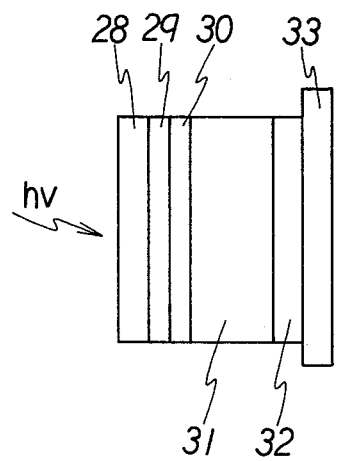
FIG. 4(b) is a schematic view illustrating the according to the present invention wherein the light impinges on the N-layer side.

Typical examples of the basic structure of the photovoltaic device according to the present invention are shown in FIGS. 4(a) and 4(b). Illustrated in FIG. 4(a) is a photovoltaic device of the type wherein the light impinges on the P-layer side, and is composed of transparent substrate 21 such as glass, ITO film 22, $SnO_2$ film 23, P-type amorphous silicon 24, intrinsic amorphous silicon 25, N-type amorphous silicon 26 and electrode 27. For instance, the device of this type has the construction: glass-ITO-$SnO_2$-P-I-N-Al. Illustrated in FIG. 4(b) is a photovoltaic device of the type wherein the light impinges on the N-layer side, and is composed of ITO film 28, $SnO_2$ film 29, N-type amorphous silicon 30, intrinsic amorphous silicon 31, P-type amorphous silicon 32 and electrode 33 such as metal. For instance, the device of this type has the construction: stainless steel-P-I-N-$SnO_2$-ITO. Other constructions may be formed, for instance, by interposing a thin insulation layer or a thin metal layer between the P-layer or N-layer and the transparent electrode layer. Any constructions are adoptable as long as the transparent electrode of the ITO-$SnO_2$ two layer structure in which the $SnO_2$ layer has a thickness of about 30 Å and about 500 Å, is provided on the P-layer or N-layer to be exposed to the light to form an ITO-$SnO_2$-P-I-N or ITO-$SnO_2$-N-I-P structure. The above-mentioned specific transparent electrode is applicable to the a-Si PIN homojunction and heterojunction photovoltaic devices.

The ITO film in the present invention is formed by subjecting $In_2O_3$ containing 3 to 15% by weight of $SnO_2$ to an electron beam deposition or sputtering method. The $SnO_2$ film of the present invention is usually doped with a slight amount of Sb, and is formed by an electron beam deposition, sputtering or chemical vapor deposition method. In the case of depositing on a transparent substrate 1 such as glass as shown in FIG. 4(a), ITO is deposited on the substrate and $SnO_2$ is then deposited thereon as a film having a thickness of about 30 to about 500 Å. Although the thickness of the ITO film is not particularly limited, it is usually selected from 600 Å to 4,000 Å, especially from 600 Å to 2,000 Å. In the case of employing a metal electrode 33 as shown in FIG. 4(b), after forming amorphous silicon semiconductors 32, 31 and 30 on the metal electrode 33, the $SnO_2$ film 29 having a thickness of 30 to 500 Å and the ITO film are formed thereon in that order.

Further improved results are obtained by fabricating a PIN heterojunction photovoltaic device employing the transparent electrode of the ITO-$SnO_2$ two layer structure. In that case, an amorphous silicon semiconductor of the general formula: a-$Si_{(1-x)}C_x$ or a-$Si_{(1-y)}N_y$, is employed in at least the layer which comes into contact with the $SnO_2$ layer, as well as the beforementioned a-$Si_{(1-x-y)}C_xN_y$ semiconductor of the present invention. The amorphous silicon carbide is formed by the glow discharge decomposition of a mixed gas containing a silicon compound and a carbon compound such as hydrocarbons, and the amorphous silicon nitride is formed by the glow discharge decomposition of a mixed gas containing a silicon compound and a nitrogen compound such as ammonia. They are doped with a P-type or N-type impurity such as phosphine or diborane.

The present invention is more specifically described and explained by means of the following Examples.

It is to be understood that the present invention is not limited to the Examples and various changes and modifications may be made in the invention without departing from the spirit and scope thereof.

EXAMPLE 1

Glow discharge decomposition was carried out at a radio-frequency of 13.56 MHz in a quartz tube having an inner diameter of 11 cm. I-type a-Si was obtained by subjecting silane diluted with hydrogen to the glow discharge decomposition at 2 to 10 Torrs. N-type a-Si was obtained similarly by subjecting silane diluted with hydrogen and phosphine ($PH_3$) ($PH_3/SiH_4$=0.5 mole %) to the glow discharge decomposition. P-type a-$Si_{(1-x-y)}C_xN_y$ was obtained similarly by subjecting silane diluted with hydrogen, methane ($CH_4$), ammonia ($NH_3$) and diborane ($B_2H_6$) [B/(Si+C+N)=0.50 atom %] to the glow discharge decomposition. In that case, the gas composition involved in the glow discharge decomposition was adjusted so that the atomic fraction (x+y) in the formula: a-Si$_{(1-x-y)}$C$_x$N$_y$, would fall in the range of from 0.80 to 0.05.

A solar cell was constructed by successively depositing the P-type a-Si$_{(1-x-y)}$C$_x$N$_y$, the I-type a-Si and the N-type a-Si in the order mentioned on the SnO$_2$ film of 25 Ω/□ and finally vacuum depositing aluminum of 3.3 mm$^2$. During the glow discharge, the temperature of the substrate was kept at 250° C. The thickness of the I-layer was 5,000 Å, the thickness of the N-layer was 500 Å and the thickness of the P-type a-Si$_{(1-x-y)}$C$_x$N$_y$ layer was 135 Å. This solar cell was tested for cell properties by use of a AM-1 solar simulator made by Ushio Electric Industry Co., Ltd. under a solar illumination power of 100 mW/cm$^2$.

The characteristics of the obtained solar cells having a construction of glass/SnO$_2$/P-type a-Si$_{(1-x-y)}$C$_x$N$_y$:H/I-type a-Si:H/N-type a-Si:H/Al are shown in Table 1 with respect to various compositions of the P-type a-Si$_{(1-x-y)}$C$_x$N$_y$.

TABLE 1

| Composition of a-Si$_{(1-x-y)}$C$_x$N$_y$ | | | | | | | | | |
|---|---|---|---|---|---|---|---|---|---|
| Atomic fraction x | 0 | 0.05 | 0.10 | 0.10 | 0.20 | 0.20 | 0.30 | 0.50 | 0.10 |
| Atomic fraction y | 0 | 0.05 | 0.10 | 0.20 | 0.10 | 0.20 | 0.30 | 0.10 | 0.50 |
| Optical energy gap Eg 19 0 opt (eV) | 1.76 | 1.89 | 1.98 | 2.10 | 2.08 | 2.15 | 2.25 | 2.23 | 2.30 |
| Electric conductivity (Ω · cm)$^{-1}$ | 5 × 10$^{-7}$ | 9 × 10$^{-7}$ | 6 × 10$^{-7}$ | 3 × 10$^{-7}$ | 3 × 10$^{-7}$ | 1 × 10$^{-7}$ | 9 × 10$^{-8}$ | 9 × 10$^{-8}$ | 5 × 10$^{-8}$ |
| Ef − Ev (eV) | 0.6 | 0.57 | 0.50 | 0.54 | 0.55 | 0.60 | 0.63 | 0.62 | 0.70 |
| Diffusion potential Vd (V) | 0.96 | 1.12 | 1.28 | 1.36 | 1.33 | 1.35 | 1.42 | 1.41 | 1.40 |
| Solar cell characteristics | | | | | | | | | |
| Short-circuit current density Jsc (mA/cm$^2$) | 10.0 | 11.3 | 11.7 | 12.3 | 12.2 | 12.6 | 13.5 | 13.4 | 13.6 |
| Open circuit voltage Voc (volt) | 0.75 | 0.84 | 0.90 | 0.91 | 0.91 | 0.92 | 0.95 | 0.94 | 0.93 |
| Curve fill factor FF (%) | 0.61 | 0.69 | 0.67 | 0.65 | 0.65 | 0.64 | 0.59 | 0.60 | 0.53 |
| Conversion efficiency η (%) | 4.6 | 6.5 | 7.1 | 7.3 | 7.2 | 7.4 | 7.6 | 7.6 | 6.7 |

(Note)
I-type a-Si:H Eg · opt = 1.8 eV
Ec − Ef = 0.85 eV
N-type a-Si:H Eg · opt = 1.8 eV
Ec − Ef = 0.2 eV It is seen in Table 1 that the conversion efficiency which is 4.6% for the P-layer made from silane alone (i.e. P-type a-Si:H) is increased to 6.5% even when the values of "x" and "y" in the amorphous semiconductor a-Si$_{(1-x-y)}$C$_x$N$_y$:H of the present invention are 0.05 and 0.05 respectively, and is increased to 7.3% when "x" is 0.10 and "y" is 0.20, and is increased to 7.6% when "x" is 0.3 and "y" is 0.3, thus indicating that the amorphous silicon carbon nitride of the invention used as P-layer of PIN heterojunction solar cells permits a marked improvement in conversion efficiency as compared with the use of P-type a-Si:H. It should be noted here that while the increase in the short-circuit current density (Jsc) is naturally expected from the fact that the optical energy gap of the a-Si$_{(1-x-y)}$C$_x$N$_y$ is greater than that of the a-Si, the increase in the open circuit voltage (Voc) is quite beyond expectation. The conspicuous improvement in the conversion efficiency is attained by the improvement in these two factors.

Substantially the same results were obtained when SiF$_4$, CH$_4$ and NH$_3$ were used instead.

Figure 3:
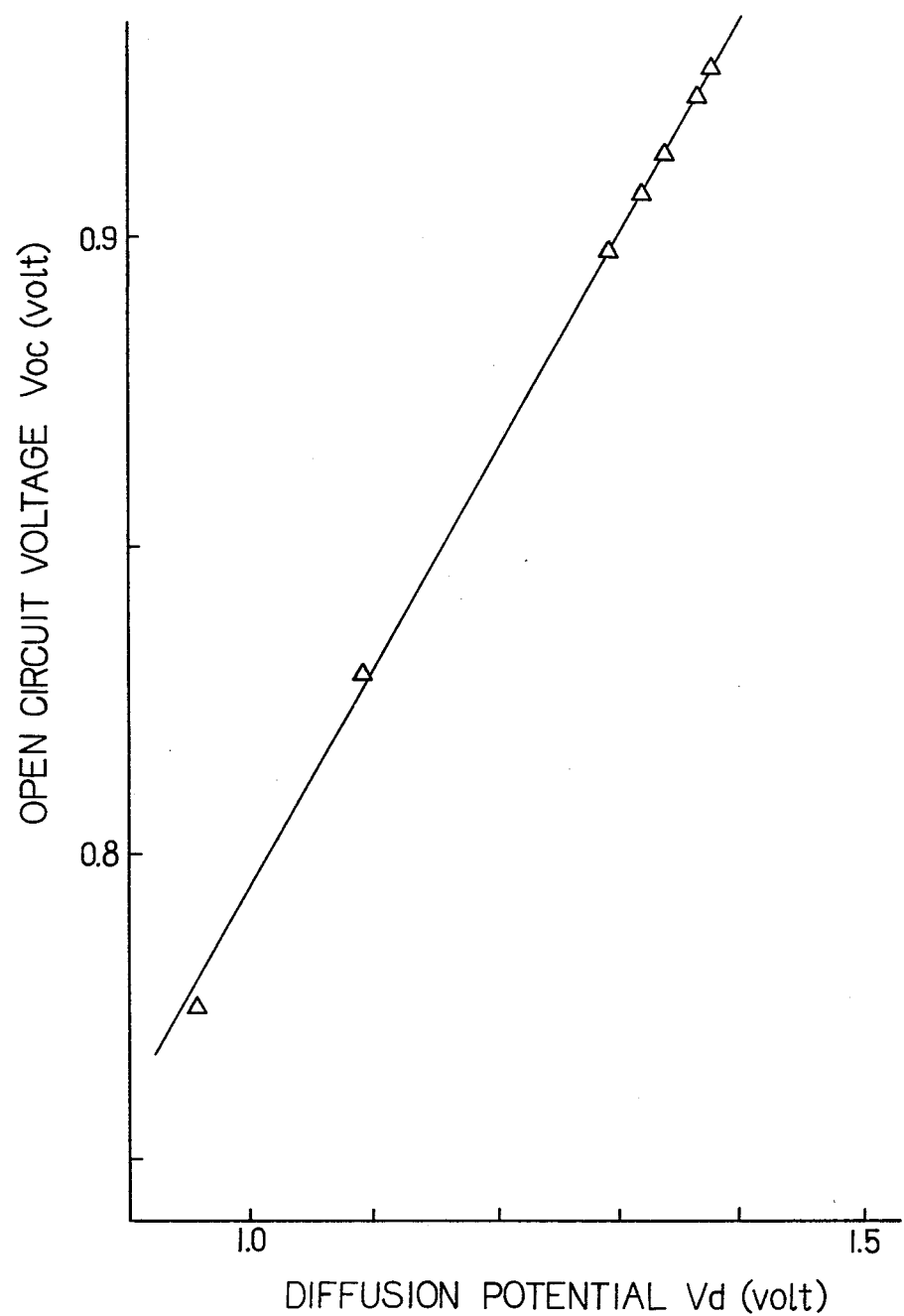
FIG. 3 is a graph showing the relationship between the diffusion potential (Vd) and the open circuit voltage (Voc) as obtained with the P-type amorphous semiconductor on the window side.

The optical energy gap (Eg.opt) of the a-Si$_{(1-x-y)}$C$_x$N$_y$ is higher than that of the a-Si as shown in Table 1, and accordingly the use of the amorphous semiconductor of the invention as window materials is naturally expected to bring about an improvement in short-circuit current density (Jsc). Moreover, it brings about an unexpected conspicuous improvement in open circuit voltage (Voc). The reason therefor evidently exists in the relation between the diffusion potential (Vd) and the open circuit voltage (Voc), which plots in a straight line, as shown in FIG. 3. This means that the value of Voc linearly increases in proportion to the increase of Vd. This fact indicates that the diffusion potential is enhanced and Voc is proportionately improved by using an amorphous semiconductor having a large optical energy gap as a material for the window of the PIN junction photovoltaic device.

As described above, when the amorphous semiconductor having an Eg.opt of at least about 1.85 eV and a PIN junction diffusion potential (Vd) of at least 1.1 volts is employed as a window material of a heterojunction photovoltaic device, marked improvements are obtained in not only Jsc, but also Voc. The same result is obtained also in the case where the N-type a-Si$_{(1-x-y)}$C$_x$N$_y$ is used as the N-layer of a photovoltaic device of the type wherein the light impinges on the N-layer side, as shown in FIG. 1(b).

EXAMPLE 2

PIN junction solar cells were prepared by employing the following 7 kinds of substrates.

(1) Glass/ITO (1000 Å, 15 Ω/□)
(2) Glass/SnO$_2$ (2500 Å, 25 Ω/□)
(3) Glass/ITO (1000 Å)/SnO$_2$ (30 Å) (15 Ω/□)
(4) Glass/ITO (1000 Å)/SnO$_2$ (50 Å) (15 Ω/□)
(5) Glass/ITO (1000 Å)/SnO$_2$ (100 Å) (15 Ω/□)
(6) Glass/ITO (1000 Å)/SnO$_2$ (300 Å) (15 Ω/□)
(7) Glass/ITO (1000 Å)/SnO$_2$ (500 Å) (15 Ω/□)

The ITO and SnO$_2$ films were formed by a sputtering method.

Glow discharge decomposition was carried out at a radio-frequency of 13.56 MHz in a quartz tube having an inner diameter of 11 cm. The temperature of the substrate was maintained at 250° C. P, I and N layers were formed on the substrate by depositing amorphous silicon layers in the order of P-type, I-type and N-type under the following conditions, and finally an aluminum electrode of 1 cm.$^2$ was formed on the N-layer by vacuum deposition to give PIN junction solar cells.

[Conditions of the preparation of P, I and N layers]

(a) Intrinsic amorphous silicon (I-type a-Si:H) SiH$_4$/H$_2$, 3 Torr, 5000 Å in thickness
(b) N-type amorphous silicon (N-type a-Si:H) PH$_3$/SiH$_4$=0.5%, 3 Torr, 500 Å in thickness
(c) P-type amorphous silicon (P-type a-Si:H) B$_2$H$_6$/SiH$_4$=0.2%, 3 Torr, 100 Å in thickness (d) P-type amorphous silicon carbide (P-type a-SiC:H)
$B_2H_6/(SiH_4+CH_4)=0.1\%$, $SiH_4/CH_4=3/7$ 3 Torr, 100 Å in thickness (e) P-type amorphous silicon nitride (P-type a-SiN:H)
$B_2H_6/(SiH_4+NH_3)=0.1\%$, $SiH_4/NH_3=1/1$ 3 Torr, 100 Å in thickness The change in the conversion efficiency of the obtained PIN junction solar cells on the basis of the difference in the substrate was observed by measuring the solar cell characteristics with the AM-1 solar simulator (100 mW/cm.$^2$).

The results for the P-type a-Si:H/I-type a-Si:H/N-type a-Si:H solar cell, the P-type a-SiC:H/I-type a-Si:H/N-type a-Si:H solar cell and the P-type a-SiN:H/I-type a-Si:H/N-type a-Si:H solar cell are shown in Tables 2-1, 2-2 and 2-3, respectively, in which "Jsc" shows the short-circuit current density, "Voc" shows the open circuit voltage, "FF" shows the fill factor and "$\eta$" shows the conversion efficiency.

TABLE 2-1

| | (P, a-Si:H/I, a-Si:H/N, a-Si:H) | | | |
|---|---|---|---|---|
| Substrate No. | Jsc (mA/cm$^2$) | Voc (V) | FF (%) | $\eta$ (%) |
| 1 | 11.0 | 0.75 | 0.68 | 5.6 |
| 2 | 10.5 | 0.80 | 0.57 | 4.8 |
| 5 | 11.0 | 0.80 | 0.67 | 5.9 |

TABLE 2-2

| | (P, a-SiC:H/I, a-Si:H/N, a-Si:H) | | | |
|---|---|---|---|---|
| Substrate No. | Jsc (mA/cm$^2$) | Voc (V) | FF (%) | $\eta$ (%) |
| 1 | 13.0 | 0.82 | 0.66 | 7.0 |
| 2 | 12.1 | 0.91 | 0.56 | 6.2 |
| 3 | 13.0 | 0.85 | 0.66 | 7.3 |
| 4 | 13.0 | 0.91 | 0.66 | 7.8 |
| 5 | 12.9 | 0.91 | 0.67 | 7.9 |
| 6 | 12.7 | 0.91 | 0.67 | 7.7 |
| 7 | 12.6 | 0.91 | 0.65 | 7.5 |

TABLE 2-3

| | (P, a-SiN:H/I, a-Si:H/N, a-Si:H) | | | |
|---|---|---|---|---|
| Substrate No. | Jsc (mA/cm$^2$) | Voc (V) | FF (%) | $\eta$ (%) |
| 1 | 12.8 | 0.81 | 0.66 | 6.8 |
| 2 | 12.4 | 0.91 | 0.57 | 6.4 |
| 5 | 12.8 | 0.91 | 0.65 | 7.6 |

It is seen in Table 2-1 that even in the case where hydrogenated amorphous silicon (a-Si:H) is used in the P-layer of a PIN junction solar cell, the conversion efficiency is improved by the use of the No. 5 substrate, i.e. glass/ITO (1000 Å)/SnO$_2$ (100 Å) (15 $\Omega/\square$). Further, it is observed in Tables 2-1 and 2-2 that the effect on the improvement of conversion efficiency is particularly marked when the substrate of the glass/ITO/SnO$_2$ type is directly brought into contact with the P-type a-SiC:H or P-type a-SiN:H. Also, it is seen from Table 2-2 that even if the substrate is of the glass/ITO/SnO$_2$ type, the substrate having an SnO$_2$ layer of not less than 50 Å in thickness (substrate Nos. 4, 5 and 6) is more preferable than that having a SnO$_2$ layer of less than 50 Å in thickness (substrate No. 3). Further, it is found that when the substrate having a SnO$_2$ layer of 500 Å in thickness is employed, the conversion efficiency is decreased somewhat.

EXAMPLE 3

Glow discharge decomposition was carried out in the same manner as in Example 2 by employing a stainless steel plate as a metal electrode. Inverted PIN junction solar cells were prepared by depositing amorphous silicon semiconductors on the metal substrate in the order of P, I and N layers under the following conditions and then providing the following transparent electrode on the N-layer by means of electron beam deposition.

[Transparent electrode]

(1) ITO (1000 Å, 15 $\Omega/\square$)
(2) SnO$_2$ (2500 Å, 25 $\Omega/\square$)
(3) SnO$_2$ (100 Å)+ITO (1000 Å) (15 $\Omega/\square$)

In the case of the transparent electrode (3), it was formed such that the SnO$_2$ layer came into contact with the N-layer.

[Conditions of the preparation of P, I and N layers]

(a) Intrinsic amorphous silicon (I-type a-Si:H) 4000 Å in thickness (b) P-type amorphous silicon (P-type a-Si:H) $B_2H_6/SiH_4=1.0\%$, 300 Å in thickness (c) N-type amorphous silicon (N-type a-Si-H) $PH_3/SiH_4=0.5\%$, 100 Å in thickness (d) N-type amorphous silicon carbide (N-type a-SiC:H) $PH_3/(SiH_4+CH_4)=0.5\%$, $SiH_4/CH_4=1/1$, 100 Å in thickness (e) N-type amorphous silicon nitride (N-type a-SiN:H) $PH_3/(SiH_4+NH_3)=0.5\%$, $SiH_4/NH_3=1/1$, 100 Å in thickness The change in the conversion efficiency of the obtained inverted PIN junction solar cells on the basis of the difference in the transparent electrode was observed by measuring the solar cell characteristics in the same manner as in Example 2.

The results for the P-type a-Si:H/I-type a-Si:H/N-type a-Si:H solar cell, the P-type a-Si:H/I-type a-Si:H/N-type a-SiC:H solar cell and the P-type a-Si:H/I-type a-Si:H/N-type a-SiN:H solar cell are shown in Tables 3-1, 3-2, 3-3, respectively.

TABLE 3-1

| | (P, a-Si:H/I, a-Si:H/N, a-Si:H) | | | |
|---|---|---|---|---|
| Transparent electrode | Jsc (mA/cm$^2$) | Voc (V) | FF (%) | $\eta$ (%) |
| 1 | 10.5 | 0.80 | 0.65 | 5.5 |
| 2 | 10.3 | 0.87 | 0.58 | 5.2 |
| 3 | 10.5 | 0.87 | 0.66 | 6.0 |

TABLE 3-2

| | (P, a-Si:H/I, a-Si:H/N, a-SiC:H) | | | |
|---|---|---|---|---|
| Transparent electrode | Jsc (mA/cm$^2$) | Voc (V) | FF (%) | $\eta$ (%) |
| 1 | 11.7 | 0.85 | 0.65 | 6.5 |
| 2 | 11.4 | 0.93 | 0.59 | 6.3 |
| 3 | 11.8 | 0.94 | 0.67 | 7.4 |

TABLE 3-3

| | (P, a-Si:H/I, a-Si:H/N, a-SiN-H) | | | |
|---|---|---|---|---|
| Transparent electrode | Jsc (mA/cm$^2$) | Voc (V) | FF (%) | $\eta$ (%) |
| 1 | 11.5 | 0.84 | 0.64 | 6.2 |
| 2 | 11.1 | 0.89 | 0.57 | 5.6 |

TABLE 3-3-continued

| (P, a-Si:H/I, a-Si:H/N, a-SiN-H) | | | | |
|---|---|---|---|---|
| Transparent electrode | Jsc (mA/cm$^2$) | Voc (V) | FF (%) | n (%) |
| 3 | 11.6 | 0.90 | 0.66 | 6.9 |

It is found from Tables 3-1, 3-2 and 3-3 that the conversion efficiency is remarkably improved also in the fabrication of inverted PIN junction solar cells whose N-layer side is exposed to the light, by the use of the ITO/SnO$_2$ transparent electrode which is provided by forming the SnO$_2$ layer on the N-layer and then forming the ITO layer on the SnO$_2$ layer.

In addition to the ingredients used in the Examples, other ingredients can be used in the Examples as set forth in the specification to obtain substantially the same results.

What we claim is:

1. In an amorphous silicon derivative PIN junction photovoltaic device, the improvement comprising a two layer transparent electrode consisting of ITO and SnO$_2$ layers that are provided on the P or N layer located on the light impinging side so that the SnO$_2$ layer is in contact with said P or N layer, said SnO$_2$ layer having a thickness of about 30 to about 500 angstroms.

2. The photovoltaic device of claim 1, wherein said SnO$_2$ layer has a thickness of about 50 to about 500 angstroms.

3. The photovoltaic device of claim 1, wherein the amorphous semiconductor of said P or N layer which contacts the SnO$_2$ layer is a member selected from the group consisting of an amorphous semiconductor of the general formula: a-Si$_{(1-x)}$C$_x$, an amorphous semiconductor of the general formula: a-Si$_{(1-y)}$N$_y$, and an amorphous semiconductor of the general formula: a-Si$_{(1-x-y)}$C$_x$N$_y$.

4. The photovoltaic device of claim 1, wherein the amorphous semiconductor of said P or N layer which contacts the SnO$_2$ layer is an amorphous semiconductor of the general formula: a-Si$_{(1-x-y)}$C$_x$N$_y$.

* * * * *